United States Patent
Rincon-Mora et al.

(10) Patent No.: US 7,560,973 B2
(45) Date of Patent: Jul. 14, 2009

(54) GATE DRIVER CIRCUIT FOR POWER TRANSISTOR

(75) Inventors: Gabriel Alfonso Rincon-Mora, Atlanta, GA (US); Matthias Arnold, Moosburg (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 11/561,681

(22) Filed: Nov. 20, 2006

(65) Prior Publication Data
US 2008/0265952 A1    Oct. 30, 2008

(30) Foreign Application Priority Data
Nov. 21, 2005   (DE) .................. 10 2005 055 415

(51) Int. Cl.
*H03K 17/687* (2006.01)
(52) U.S. Cl. ...................................... 327/427
(58) Field of Classification Search ........... 327/365, 327/419, 427
See application file for complete search history.

(56) References Cited

U.S. PATENT DOCUMENTS

| | | | |
|---|---|---|---|
| 4,713,625 A | | 12/1987 | Whatley |
| 5,148,064 A | * | 9/1992 | Kevorkian et al. .......... 327/427 |
| 5,986,927 A | * | 11/1999 | Minch et al. ........... 365/185.01 |
| 6,747,492 B2 | | 6/2004 | Govil et al. |
| 7,116,153 B2 | * | 10/2006 | Pai .............................. 327/430 |
| 7,180,337 B2 | * | 2/2007 | Feldtkeller .................. 327/108 |

* cited by examiner

*Primary Examiner*—Jeffrey S Zweizig
(74) *Attorney, Agent, or Firm*—William B. Kempler; Wade J. Brady, III; Frederick J. Telecky, Jr.

(57) ABSTRACT

A circuit arrangement with a gate driver circuit for a power transistor is disclosed which is suitable for low voltage applications, permitting a rail-to-rail output without a loss in speed/bandwidth, which is very simple, low cost, low current and area efficient. The gate driver circuit comprises a drain follower with a MOS driver transistor having the gate connected to an interconnection node of a capacitive divider. A first capacitor of the capacitive divider is connected between the drain and the gate and a second capacitor is connected between the gate and an input of the gate driver circuit. The gate driver has the required low impedance for driving the gate of the power transistor.

8 Claims, 1 Drawing Sheet

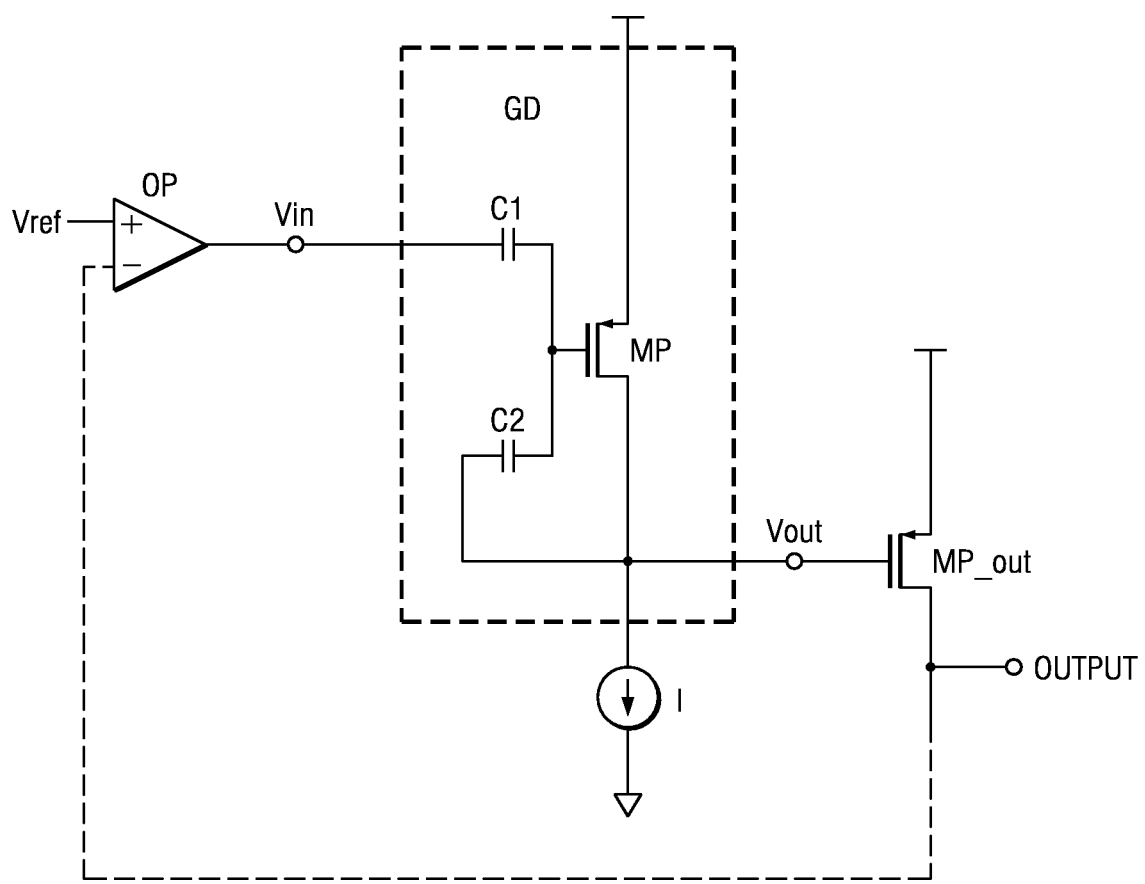

GATE DRIVER CIRCUIT FOR POWER TRANSISTOR

The invention relates to a gate driver circuit for a power transistor, and a power transistor circuit including the same.

BACKGROUND

Typical driver circuits comprise a source follower. A source follower circuit has the desired low output impedance. Source follower circuits, however, have an input-to-output voltage drop which makes them unsuitable for low voltage applications, as well as for driving large PMOS transistors. For example, if the output voltage needs to be within 500 mV of the positive voltage supply, a typical n-type source follower, or even an n-type emitter follower, may fail to provide the required drive voltage. Conversely, if a p-type source follower is used, the output voltage cannot be driven to within 500 mV of ground level, which is a typical requirement of low voltage applications (rail-to-rail circuits), not to mention linear regulators where the PMOS switch needs to be completely off in one extreme and sourcing large amounts of current in the other extreme, even with small input voltages. As an alternative, a differential amplifier in unity gain configuration can be used, but at the expense of complexity, die area, cost and speed/bandwidth.

SUMMARY

The invention provides a gate driver circuit for a power transistor which is suitable for low voltage applications, permitting a rail-to-rail output without a loss in speed/bandwidth, and which is very simple, low cost, low current and area efficient.

In one embodiment, the invention provides a circuit arrangement with a gate driver circuit for a power transistor. The gate driver circuit comprises a drain follower with a MOS driver transistor having its gate connected to an interconnection node of a capacitive divider. A first capacitor of the capacitive divider is connected between the drain and the gate of the MOS driver transistor and a second capacitor is connected between the gate of the MOS driver transistor and an input of the gate driver circuit. Since a MOS device is "field driven" by the application of a voltage to its gate which induces a conductive channel underneath the gate with the resulting electric field, the gate can be considered as an electrode of a capacitor.

In one aspect, the invention proposes to apply a field inducing gate voltage through a capacitive divider. Accordingly, the gate of the power transistor has no DC bias applied that would alter the operating point of the circuit. In operation, since the input to the circuit is not expected to be static, the gate will be biased dynamically. The drain follower is in fact configured as a common-source amplifier stage. Due to the negative feedback provided by the capacitor connecting the gate of the power transistor with its drain, the gain of the amplifier stage is unity. The amplifier has the desired low output impedance and an output voltage swing that is nearly rail-to-rail.

An implementation of the circuit arrangement comprises a MOS power transistor and a differential amplifier. The MOS power transistor has a gate connected to the drain of the MOS driver transistor and a drain providing an output of the circuit arrangement. The differential amplifier has an output connected to the input of the gate driver circuit, a first input connected to the output of the circuit arrangement and a second input for application of a reference voltage signal. Since the connection between the output and the first input of the differential amplifier closes a negative feedback loop, the voltage at the output of the drain follower (i.e. at the drain of the common-source amplifier transistor) is forced to assume whatever value it must be to modulate the conductance of the MOS power transistor as needed for an output voltage swing from rail to rail. The MOS power transistor is preferably of the usual p-channel type. In that case, the MOS driver transistor is also of the p-channel type. In such a circuit configuration the differential amplifier has a relatively high output impedance. The drain follower stage converts the output of the differential amplifier to the required low impedance for driving the gate of the MOS power transistor.

BRIEF DESCRIPTION OF THE DRAWINGS

Further advantages and features of the invention will become apparent from the following description, with reference to the accompanying drawing. The single FIGURE of the drawing is a schematic diagram of an example implementation the inventive circuit arrangement.

DETAILED DESCRIPTION

The drawing FIGURE shows a circuit arrangement that can be used to drive a MOS power transistor in a low supply voltage application in which the output is required to operate with a close-to-rail voltage swing. Specifically, a PMOS power transistor MP_out is connected in a common-source configuration with its drain connected to an output (OUTPUT) that provides an output voltage. The gate of transistor MP_out is connected to the output Vout of a gate driver circuit generally indicated at GD. An operational amplifier OP has its output connected to provide an input Vin of the gate driver circuit. The operational amplifier OP has a first input connected to receive a reference voltage Vref, and a second input coupled to the output at the drain of transistor MP_out.

Gate driver circuit GD includes a PMOS driver transistor MP arranged in a drain follower configuration, with its drain connected to a current sink I and providing the gate driver circuit output Vout. The gate of transistor MP is connected to the gate driver circuit input Vin through a first capacitor C1 and is connected with the drain of transistor MP through a second capacitor C2. Capacitor C2 provides a negative feedback to the common-source amplifier stage formed by transistor MP and current sink I. Capacitors C1 and C2 form a capacitive divider with an interconnection node to which the gate of transistor MP is connected.

Since both transistors MP and MP_out are arranged in common-source configurations, each forms an inverting amplifier. The connection from the gate driver circuit output Vout to the second input of operational amplifier OP thus closes a negative feedback loop (indicated schematically as a dashed line).

In operation, a reference voltage Vref is applied to the first input of operational amplifier OP and amplified to provide input Vin to the gate driver circuit GD. The negative feedback loop forces the common-source amplifier with transistor MP to provide whatever voltage is needed at the gate of transistor MP_out to modulate its conductance for the required output voltage Vout in a range of nearly from rail to rail.

What is claimed is:

1. Apparatus including a gate driver circuit for driving a gate of a MOS power transistor, the gate driver circuit comprising a drain follower having a MOS driver transistor with its gate connected to an interconnection node of a capacitive divider, the capacitive divider having a first capacitor connected between the drain and gate of the MOS driver transistor and a second capacitor connected between the gate and an input of the gate driver circuit, the MOS power transistor having a gate connected to receive a driving output from the drain of the MOS driver transistor and having a drain for providing a power transistor output, a differential amplifier having an output connected to the input of the gate driver circuit, a first input connected to receive the power transistor output and a second input for application of a reference voltage signal.

2. Apparatus as in claim 1, wherein the first and second capacitors are of like capacitance.

3. Apparatus as in claim 1, wherein the MOS driver transistor and the MOS power transistor are both of p-channel type.

4. Apparatus as in claim 2, wherein the MOS driver transistor and the MOS power transistor are both of p-channel type.

5. Apparatus as in claim 1 further comprising a current sink in series with the MOS driver transistor.

6. Apparatus as in claim 2 further comprising a current sink in series with the MOS driver transistor.

7. Apparatus as in claim 3 further comprising a current sink in series with the MOS driver transistor.

8. Apparatus as in claim 4 further comprising a current sink in series with the MOS driver transistor.

* * * * *